Figure 1:
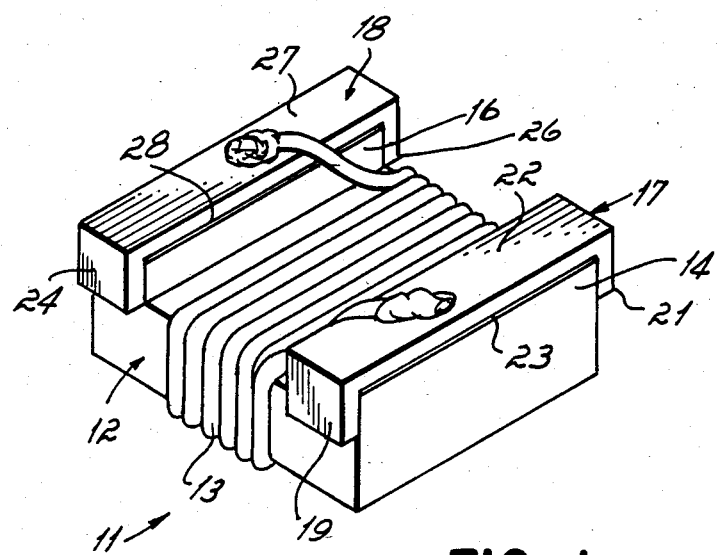

United States Patent [19]

Hill

[11] Patent Number: 4,588,974
[45] Date of Patent: May 13, 1986

[54] COIL ASSEMBLY HAVING CLAMPED AND BONDED CONTACTS

[75] Inventor: John Hill, Cincinnati, Ohio

[73] Assignee: Standex International Corporation, Salem, N.H.

[21] Appl. No.: 640,945

[22] Filed: Aug. 15, 1984

[51] Int. Cl.[4] .................... H01F 15/10; H01F 27/30
[52] U.S. Cl. .................................. 336/192; 336/208
[58] Field of Search ............... 336/192, 107, 65, 198, 336/208; 361/310, 306; 339/17 LC, 17 F; 338/332

[56] References Cited

U.S. PATENT DOCUMENTS

| | | | |
|---|---|---|---|
| 3,697,817 | 10/1972 | Yongue | 336/208 |
| 4,004,200 | 1/1977 | Johanson | 361/310 |
| 4,149,135 | 4/1979 | Roespel et al. | 336/192 |
| 4,245,207 | 1/1981 | Murakami et al. | 336/65 |
| 4,425,702 | 1/1984 | Murakami et al. | 264/272.19 |
| 4,455,544 | 6/1984 | Sibille et al. | 336/65 |

FOREIGN PATENT DOCUMENTS 2348482  10/1975  Fed. Rep. of Germany ... 339/17 LC

Primary Examiner—Thomas J. Kozma
Attorney, Agent, or Firm—Wood, Herron & Evans

[57] ABSTRACT

A coil assembly having a core and a winding on the core, wherein a contact element electrically connected to the winding is both mechanically clamped and bonded to the core. In an exemplary microcoil assembly having a C-core, a generally U-shaped contact element is bonded to each foot of the core by epoxy and mechanically clamped to the core foot to hold the contact element in position while the epoxy cures. One end of the coil winding is soldered to one of the contact elements and the other end of the winding is soldered to the other contact element. The coil assembly is subsequently soldered onto a printed circuit board. Each contact element may include a pin portion to be inserted into a printed circuit board.

9 Claims, 2 Drawing Figures

COIL ASSEMBLY HAVING CLAMPED AND BONDED CONTACTS

DESCRIPTION OF THE INVENTION

This invention relates generally to inductors and more particularly concerns a coil assembly including a core, a winding on the core, and a contact element electrically connected to the winding which is both mechanically clamped and bonded to the core.

One type of conventional coil assembly takes the form of a core, often of a magnetic material such as a ferrite, and a winding wound on the core. Means are provided for making electrical connections to the winding to permit the use of the coil in an electrical circuit. Means are also provided for physically mounting the coil assembly in a circuit, such as on a printed circuit board. Such coils may be surface mounted on a printed circuit board, wherein the coils are soldered to the copper pattern side of the board; or, the coil mounting assembly may include pins which pass through the board, and which are soldered to the underside of the board.

In many types of coil assemblies, particularly small coil assemblies, an electrically conductive contact element, or pad, is bonded to a portion of the core and subsequently soldered onto the printed circuit board. In a simple coil assembly, two such contact elements, spaced apart from one another on the core, are provided; and one end of the winding is soldered to one of the contact elements, and the other end of the winding is soldered to the other contact element. The contact elements, and connected winding terminations, are then soldered onto the printed circuit board.

Conventionally, a layer of epoxy is applied to the contact element or to a location on the core to which the contact element, or pad, is to be bonded, and the pad is held in place on the core until the epoxy has cured to establish the desired bond. The smaller the core and pad, the more difficult it is to handle the pad and to maintain the pad in position on the core during bonding. For typical microcoils, such pads might have edge dimensions of a few millimeters or less. The manipulation and alignment of the pads, and the maintenance of the pads in position during bonding can be extremely difficult.

It is the general aim of the present invention to provide a contact element for coils of the foregoing type which may be readily and accurately positioned on a core during bonding of the element to the core.

In carrying out the invention, a contact element for a coil assembly is provided which is both mechanically clamped to the core and also bonded to the core. In this way, the mechanical clamping force holds the contact element in place during bonding, thereby eliminating problems of manipulating and holding the contact element.

In the illustrated form of the invention, a generally U-shaped contact element is clamped onto each foot of a C-core and also bonded to the bottom of the core foot. Each end of a winding on the core is soldered to a different one of the contact elements, and the completed coil assembly may be subsequently connected into an electrical circuit such as by soldering onto a printed circuit board. Advantageously, during the fabrication of the coil assembly, the mechanical clamping force of each contact element holds the element in place on the C-core foot during bonding so that each contact element need not be held in place during bonding.

Figure 2:
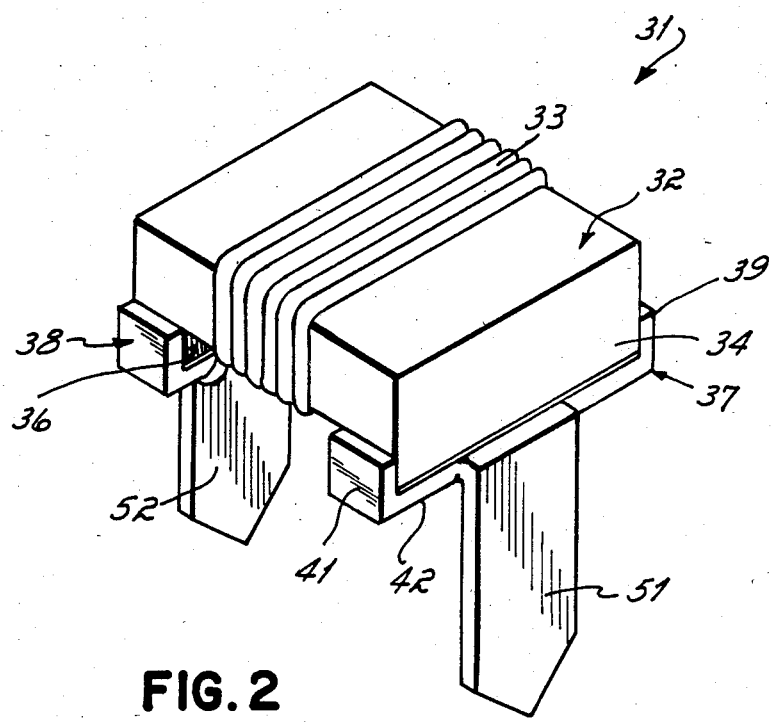

Other objects and advantages of the invention, and the manner of their implementation, will become apparent upon reading the following detailed description and upon reference to the drawings, in which:

FIG. 1 is a perspective view, as seen from the bottom, of a microcoil assembly constructed in accordance with the present invention; and FIG. 2 is a perspective view, as seen from the top, of an alternative form of the assembly of FIG. 1.

While the invention is susceptible to various modifications and alternative forms, certain illustrative embodiments have been shown by way of example in the drawings and will herein be described in detail. It should be understood, however, that it is not intended to limit the invention to the particular form disclosed, but, on the contrary, the intention is to cover all modifications, equivalents, and alternatives falling within the spirit and scope of the invention as defined by the appended claims.

With reference to FIG. 1, a microcoil assembly 11 includes a core 12 upon which is wound a winding 13. The core 12 is a C-core having a winding-bearing portion and two feet 14, 16. One end of the winding 13 is electrically connected to a contact element 17 on the foot 14, and the other end of the winding 13 is electrically connected to a contact element 18 on the foot 16.

The contact element 17 is generally U-shaped, having a pair of legs 19, 21 joined by an intermediate web portion 22. In order to secure the contact element 17 on the foot 14 of the core, a layer of epoxy 23 is applied to the bottom surface of the foot 14, or to the mating surface of the contact element, and the contact element is mechanically secured on the core foot with the epoxy layer pressed between the web portion 22 of the contact element and the bottom of the foot of the core. To secure the contact element 17 on the foot 14, the web 22 of the contact element is bent slightly, spreading the legs 19, 21 slightly apart, and the contact element is positioned with the legs 19, 21 on opposite sides of the core foot 14. When the bending force on the web 22 is released, the legs 19, 21 move toward one another and grip the foot 14 of the core 12, applying a mechanical clamping force to the core and holding the contact element in position. After the epoxy 23 has cured, the contact element is bonded to the core and held securely in position.

The contact element 18 has a pair of legs 24, 26 joined by an intermediate web portion 27 and is mounted on the core leg 16 in the same fashion as the contact element 17 is mechanically secured to the foot 14 of the core 12. An epoxy layer 28, between the web 27 and the bottom of the foot 16 bonds the contact element 18 to the core in the same manner as the epoxy layer 23.

In order to provide an electrical connection between the first end of the winding 13 and the contact element 17, the end of the winding is soldered to the lower surface of the web 22 of the contact element 17. Similarly, the second end of the winding 13 is soldered to the lower surface of the intermediate web 27 of the contact element 18. The coil assembly 11 may then be surface mounted on a printed circuit board by soldering the bottom surfaces of the webs 22, 27 to the appropriate portions of the copper pattern on the printed circuit board. Advantageously, when the coil assembly 11 is soldered on a printed circuit board, a visible solder joint is produced so that proper electrical connection of the assembly to the board can be visually verified. This visible solder joint is produced along the outer faces of the legs such as 19 adjacent the circuit board.

With reference now to FIG. 2, wherein an alternative construction for the contact elements is shown, a coil assembly 31 includes a winding 33 wound on a core 32 which includes a pair of feet 34, 36. As in the case of the coil assembly 11, the ends of the winding 33 are soldered to a pair of contact elements 37, 38 which are secured to the core feet 34, 36, respectively. The contact element 37 has a pair of legs 39, 41 joined by an intermediate web portion 42. The contact element 37 is clamped and bonded to the core foot 34 in the same manner as the contact element 17 is secured to the foot 14 in the coil assembly 11. The contact element 38 is substantially identical to the contact element 37 and is attached to the core foot 36 in the same manner as the contact element 37 is secured to the core foot 34.

The contact element 37 further includes a downwardly extending pin portion 51. The contact element 38 also includes a downwardly extending pin portion 52. The coil assembly 31 may be mounted on a printed circuit board by inserting the pins 51, 52 through holes in the printed circuit board and soldering the pins to the appropriate portions of the copper pattern on the underside of the board. Electrical connection from the circuit board to the winding 33 is provided via the contact elements 37, 38 to which the ends of the coil 33 are soldered.

While the invention has been described in connection with coil assemblies employing C-cores, many other types of core configurations may be employed in practicing the invention. For example, if contact elements having a sufficient thickness in the web portion are used, the contact elements may be mounted on an I-core (having no feet), with the contact elements serving to maintain the coil winding spaced apart from the board.

What is claimed is:

1. A coil assembly comprising:
    a core;
    an inductive winding on the core;
    an electrically conductive contact element on the core, formed to have a web and at least two generally opposed portions applying a clamping force to the core, electrically connected to a first location on the winding; and
    a resin adhesive means on and between the web and core bonding the contact element to the core, said clamping force serving to hold the contact element in place on the core during bonding.

2. The coil assembly of claim 1 which further comprises a second electrically conductive contact element on the core, spaced apart from the first contact element and formed to have at least two generally opposed portions applying a clamping force to the core, the second contact element being electrically connected to a second location on the winding.

3. The coil assembly of claim 2 in which the first contact element is electrically connected to a first end of the winding and the second contact element is electrically connected to a second end of the winding.

4. A coil assembly comprising:
    a core;
    an inductive winding on the core;
    a generally U-shaped electrically conductive contact element on the core, having a pair of legs spaced apart from one another and connected by an intermediate web portion, the two legs contacting, and applying a clamping force to, opposite sides of the core, the contact element being electrically connected to a first location on the winding; and a resin adhesive means on and between the web and core bonding the contact element to the core, said clamping force serving to hold the contact element in place on the core during bonding.

5. The coil assembly of claim 4 which further comprises a second generally U-shaped electrically conductive contact element on the core, having a pair of legs spaced apart from one another and connected by an intermediate web portion, the legs contacting, and applying a clamping force to, opposite sides of the core, the second contact element being electrically connected to a second location on the winding.

6. The coil assembly of claim 5 in which the first contact element is electrically connected to a first end of the winding and the second contact element is electrically connected to a second end of the winding.

7. The coil assembly of claim 4 in which the contact element further comprises a pin portion, extending beyond the intermediate web portion, for insertion in a printed circuit board.

8. A coil assembly comprising:
    a core having a first and a second foot;
    an inductive winding on the core having a first end and a second end;
    a first generally U-shaped electrically conductive contact element having two spaced apart legs contacting, and applying a clamping force to, opposite sides of the first foot of the core and an intermediate web portion between the legs contacting the bottom of the first foot of the core, electrically connected to a first end of the winding;
    a second generally U-shaped electrically conductive contact element, having a pair of spaced apart legs contacting, and applying a clamping force to, opposite sides of the second foot of the core and an intermediate web portion contacting the bottom of the second foot of the core, electrically connected to a second end of the winding;
    a resin adhesive means on and between the web and core bonding the first contact element to the first foot of the core; and
    a resin adhesive means on and between the web and core bonding the second contact element to the second leg of the core, each said clamping force serving to hold each contact element in place on the core during bonding.

9. The coil assembly of claim 8 in which each said contact element includes a pin portion extending downwardly from the intermediate web portion of the contact element to be received in a printed circuit board.